(12) United States Patent
Sugimoto

(10) Patent No.: US 7,928,885 B2
(45) Date of Patent: Apr. 19, 2011

(54) A/D CONVERTER

(75) Inventor: Tomohiko Sugimoto, Kanagawa (JP)

(73) Assignee: Kabushiki Kaisha Toshiba

( * ) Notice: Subject to any disclaimer, the term of this patent is extended or adjusted under 35 U.S.C. 154(b) by 30 days.

(21) Appl. No.: 12/480,094

(22) Filed: Jun. 8, 2009

(65) Prior Publication Data
US 2010/0079202 A1  Apr. 1, 2010

(30) Foreign Application Priority Data

Sep. 30, 2008  (JP) .................... 2008-254614

(51) Int. Cl.
*H03M 1/12* (2006.01)
(52) U.S. Cl. ........ 341/155; 341/159; 341/158; 341/161; 341/120
(58) Field of Classification Search ............. 341/155, 341/120, 159, 158, 160, 161
See application file for complete search history.

(56) References Cited

U.S. PATENT DOCUMENTS

| 6,674,389 B2 * | 1/2004 | Bult ............................. 341/159 |
| 6,822,600 B1 * | 11/2004 | Taft et al. ...................... 341/155 |
| 6,888,482 B1 * | 5/2005 | Hertle .......................... 341/120 |

FOREIGN PATENT DOCUMENTS

| JP | 2004-194305 | 7/2004 |
| JP | 2005-354627 | 12/2005 |
| JP | 2008-072742 | 3/2008 |

* cited by examiner

*Primary Examiner* — Jean B Jeanglaude
(74) *Attorney, Agent, or Firm* — Turocy & Watson, LLP

(57) ABSTRACT

An A/D converter provides one or more operational amplifiers as components. The A/D converter includes a current controlling unit that is activated before an actual operation of the A/D converter to control a current of at least one of the operational amplifiers based on a settling characteristic of the operational amplifier.

8 Claims, 5 Drawing Sheets

US 7,928,885 B2

A/D CONVERTER

CROSS-REFERENCE TO RELATED APPLICATIONS

This application is based upon and claims the benefit of priority from the prior Japanese Patent Application No. 2008-254614, filed on Sep. 30, 2008; the entire contents of which are incorporated herein by reference.

BACKGROUND OF THE INVENTION

1. Field of the Invention

The present invention relates to Analog-to-Digital (A/D) converters.

2. Description of the Related Art

An A/D converter is designed according to specifications required for an electronic device in which the A/D converter is to be actually incorporated. If the electronic device has a plurality of sets of specifications required, the A/D converter is designed according to one that is strictest.

In general, as the characteristics of the A/D converter required are stricter, an operational amplifier, which is a component of the A/D converter, requires more currents. Therefore, when the A/D converter is used under at least two sets of specifications, a current more than necessary is supplied to the operational amplifier at the time of use with a less-strict set of specifications, resulting in wasteful power consumption in the A/D converter.

Specifically, for example, an A/D converter that switches between a low-speed operation and a high-speed operation lets a current more than necessary flow through the operational amplifier at the time of a low-speed operation. To solve this problem, for example, JP-A 2008-72742 (KOKAI) suggests that the current to be supplied to the operational amplifier is decreased at the time of a low-speed operation. In this patent document, however, a specific method of decreasing the supply current is not disclosed.

Also, in the design of the A/D converter, a margin under worst conditions is set in consideration of variations in characteristics of the operational amplifier for use, fluctuations in power-supply voltage, changes in environment temperature, and others. However, for example, the variations in characteristic of the operational amplifier for use may be more lenient in circuit characteristics. In this case, a current more than necessary flows through the operational amplifier, thereby also disadvantageously causing wasteful power consumption.

BRIEF SUMMARY OF THE INVENTION

According to one aspect of the present invention, an A/D converter with one or more operational amplifiers as components, the A/D converter includes a current controlling unit that is activated before an actual operation of the A/D converter to control a current of at least one of the operational amplifiers, based on a settling characteristic of the operational amplifier.

According to another aspect of the present invention, a consumption-power optimizing method of an A/D converter with one or more operational amplifiers as components, the method includes providing a fixed voltage to at least one of the operational amplifiers before an actual operation of the A/D converter, and generating a comparison timing signal at a time near a timing when an output voltage of the operational amplifier starts saturation; comparing the output voltage of the operational amplifier with one or more reference values in response to an occurrence of the comparison timing signal; and controlling a current of the operational amplifier based on at least one comparison result obtained by comparing with one or more reference values.

DETAILED DESCRIPTION OF THE INVENTION

Exemplary embodiments of an A/D converter according to the present invention will be explained below in detail with reference to the accompanying drawings. The present invention is not limited to the following embodiments.

Figure 1:
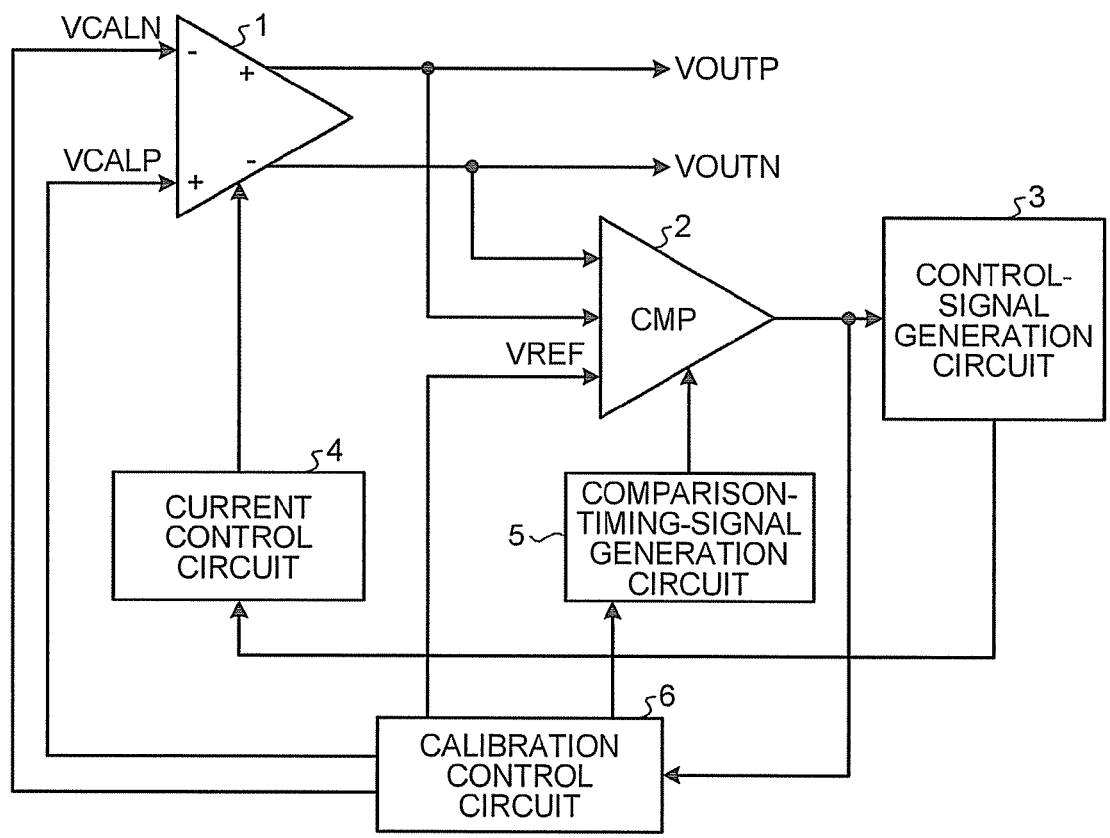
FIG. 1 is a block diagram of an example of configuration of a current controlling unit incorporated in an A/D converter according to a first embodiment of the present invention.
Figure 2:
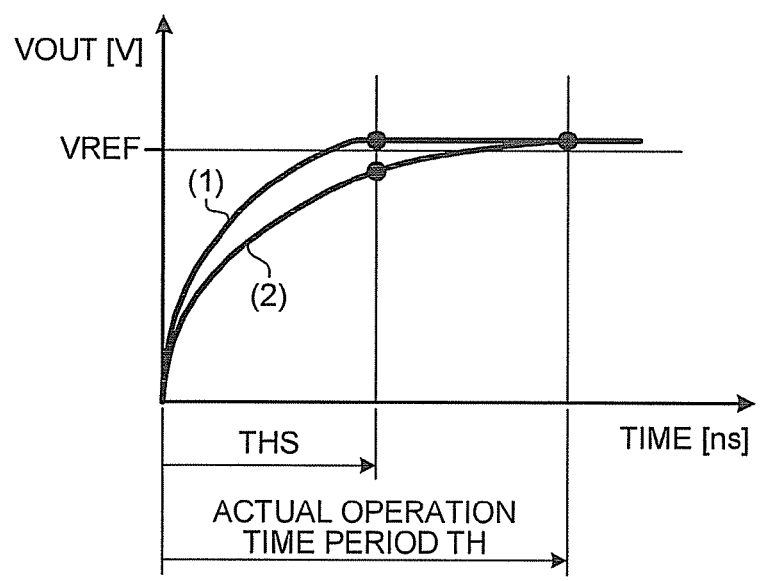
FIG. 2 is a diagram for explaining the operation of the current controlling unit depicted in FIG. 1.

FIG. 1 is a block diagram of an example of configuration of a current controlling unit incorporated in an A/D converter according to a first embodiment of the present invention. FIG. 2 is a diagram for explaining the operation of the current controlling unit depicted in FIG. 1.

In FIG. 1, an operational amplifier 1 is a component singly or plurally provided to an A/D converter according to the present embodiment. This operational amplifier 1 has a differential-input-output configuration in the present embodiment, but may have a single configuration.

A current controlling unit according to the first embodiment includes a comparator circuit (CMP) 2, a control-signal generation circuit 3, a current control circuit 4, a comparison-timing-signal generation circuit 5, and a calibration control circuit 6. In this configuration, the current controlling unit according to the first embodiment performs calibration for controlling a current of a current source in the operational amplifier 1 during a predetermined period before the A/D converter performs an actual operation.

The operational amplifier 1 has an inverting input terminal (−) and a non-inverting input terminal (+) to which an output of the preceding circuit is input at the time of actual operation and fixed voltages, that is, calibration voltages VCALN and VCALP, respectively, are provided from the calibration control circuit 6 at the time of calibration.

At the time of performing calibration, the calibration control circuit 6 gives the comparison-timing-signal generation circuit 5 an instruction for starting an operation, whenever the calibration control circuit 6 provides the fixed voltages, that is, the calibration voltages VCALN and VCALP, a predetermined number of times to the inverting input terminal (−) and the non-inverting input terminal (+), respectively, of the operational amplifier 1.

Output voltages VOUTP and VOUTN (hereinafter, both are simply referred to as "VOUT") of the operational amplifier 1 are provided to the comparator circuit 2 and also, for example, to an operational amplifier not shown that is disposed at the subsequent stage. Furthermore, to the comparator circuit 2, a reference voltage VREF is input from the calibration control circuit 6, and also a comparison timing signal is input from the comparison-timing-signal generation circuit 5.

The output voltage VOUT, when a fixed voltage is provided to the operational amplifier 1 with a differential input/output configuration, shows a characteristic of increasing (decreasing) with a rising (falling) characteristic at a speed depending on the current flowing through the operational amplifier 1 to saturation. This behavior of the output voltage VOUT is known as a settling characteristic. In the present embodiment, by using output saturation in this settling characteristic, the current flowing through the operational amplifier 1 is controlled.

That is, a reference voltage VREF to be provided to the comparator circuit 2 is defined near a voltage at the time of output saturation in the setting characteristic of the operational amplifier 1. Also, the comparison-timing-signal generation circuit 5 is configured to generate a comparison timing signal to be given to the comparator circuit 2, during a period from the input to a timing near when the output of the operational amplifier 1 starts saturation, whenever an instruction for starting an operation is input from the calibration control circuit 6.

Specific explanation is now made with reference to FIG. 2. In FIG. 2, for convenience of explanation, only the settling characteristic when the output voltage VOUT rises is depicted. Characteristics (1) and (2) depicted in FIG. 2 are settling characteristics of the output voltage VOUT provided to the comparator circuit 2 before calibration when a fixed voltage is actually provided to the operational amplifier 1. However, the characteristic (2) may be a settling characteristic after calibration.

A time period THS depicted in FIG. 2 represents a time period from the time when a fixed voltage is provided to the operational amplifier 1 to the timing near when output saturation starts. Immediately after a lapse of this time period THS, the comparison-timing-signal generation circuit 5 generates a comparison timing signal so that the comparator circuit 2 performs comparison.

When the A/D converter is of a pipeline or cyclic type, a comparator circuit included in such a pipeline or cyclic type can be used also as the comparator circuit 2. Therefore, in FIG. 2, an actual operation time period TH at the comparator circuit of the pipeline or cyclic type is depicted. The actual operation time period TH is a period until the state of output saturation continues for a predetermined time period, and therefore TH>THS. With this, at the time of calibration, the time of output saturation in the settling characteristic can be confirmed early, thereby preventing a wasteful current from flowing through the operational amplifier 1.

Now the operation is explained. In the characteristic (1), since the current value of the operational amplifier 1 is large, the output voltage VOUT increases with early rising to reach output saturation immediately after a lapse of the time period THS. The output voltage at the time of output saturation exceeds a reference voltage VREF. In the characteristic (2), since the current value of the operational amplifier 1 is small, the output voltage VOUT increases as rising slower than the characteristic (1). Immediately after a lapse of the time period THS, no output saturation is shown yet, and its voltage is at a level of not reaching the reference voltage VREF.

When the comparison timing signal is input from the comparison-timing-signal generation circuit 5, the comparator circuit 2 compares the output voltage VOUT from the operation amplifier 1 and the reference voltage VREF, and then outputs the comparison result to the control-signal generation circuit 3. In this example, the relation in magnitude between the output voltage VOUT and the reference voltage VREF indicated by the comparator circuit 2 is either one of "VOUT>VREF" (characteristic (1)) and "VOUT<VREF" (characteristic (2)).

Based on the comparison result from the comparator circuit 2, the control-signal generation circuit 3 outputs to the current control circuit 4 a control signal for indicating how to control the current of the operational amplifier 1. In this example, a control signal for "decreasing the current" is generated when the comparison result indicates "VOUT>VREF", while a control signal for "keeping the current as it is" when the comparison result indicates "VOUT<VREF".

When the control signal from the control-signal generation circuit 3 is to "decrease the current", the current control circuit 4 performs control for decreasing the current value of the operational amplifier 1 by a predetermined value. Also, when the control signal from the control-signal generation circuit 3 is to "keep the current as it is", the current control circuit 4 performs control for maintaining the current value of the operational amplifier 1 at the current value.

The calibration control circuit 6 monitors the comparison result at the comparator circuit 2 and, when the first comparison result indicates "VOUT>VREF" (when the settling characteristic of the operational amplifier 1 shows the characteristic (1) depicted in FIG. 2), each component is controlled so that calibration as explained above for decreasing the current value by a predetermined value is repeated until the settling characteristic of the operational amplifier 1 becomes the characteristic (2) depicted in FIG. 2 (until the comparison result becomes "VOUT<VREF"). Then, when the settling characteristic of the operational amplifier 1 becomes the characteristic (2) depicted in FIG. 2 and the comparison result indicates "VOUT<VREF", the calibration ends.

On the other hand, when the calibration control circuit 6 monitors the comparison result at the comparator circuit 2 and the first comparison result indicates "VOUT<VREF" (when the settling characteristic of the operational amplifier 1 shows the characteristic (2) depicted in FIG. 2), the calibration ends in principle.

As explained above, according to the first embodiment, calibration of decreasing the current when the saturation voltage in the settling characteristic of the operational amplifier exceeds the reference value, so as to bring the output voltage level of the operational amplifier close to the reference value, thereby achieving the best state with the settling characteristic of the operational amplifier brought close to the design value.

Therefore, at the time of an actual operation of the A/D converter, it is possible to prevent a current more than necessary from being supplied to the operational amplifier 1, thereby achieving low power consumption in the A/D converter. Also, the A/D converter can be configured so that the calibration as explained above can be automatically performed, thereby achieving automatic current optimization. Here, in the calibration as explained above, a calibration time can be defined so that the calibration can be completed before an actual operation of the A/D converter. Therefore, the calibration does not affect the actual operation of the A/D converter.

Figure 3:
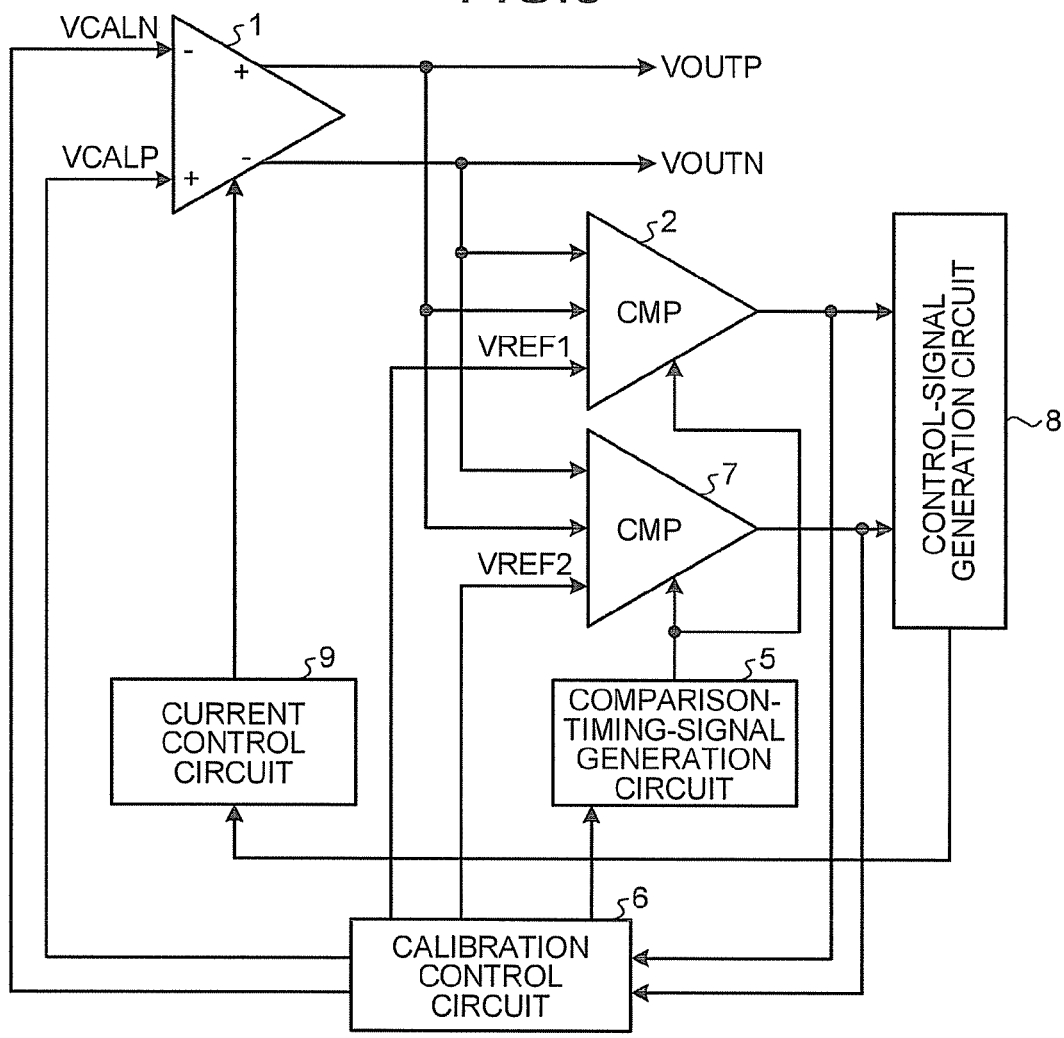
FIG. 3 is a block diagram of an example of configuration of a current controlling unit incorporated in an A/D converter according to a second embodiment of the present invention.

FIG. 3 is a block diagram of an example of configuration of a current controlling unit incorporated in an A/D converter according to a second embodiment of the present invention. Here in FIG. 3, components similar or equivalent to those depicted in FIG. 1 (first embodiment) are provided with same reference numerals. Here, explanation is made mainly to portions regarding the second embodiment.

As depicted in FIG. 3, the current controlling unit according to the second embodiment has the configuration depicted in FIG. 1 (first embodiment), with a comparator circuit (CMP) 7 being added thereto and with the control signal generation circuit and the current control circuit being provided with changed reference numerals 8 and 9, respectively.

The added comparator circuit 7 is provided with the output voltage VOUT of the operational amplifier 1, as with the comparator 2. A reference voltage provided to the comparator circuit 2 is the same as the reference voltage VREF depicted in FIG. 1, but is referred to as VREF1 in FIG. 3. A reference voltage provided to the comparator circuit 7 is indicated by VREF2. The relation in magnitude between these voltages is VREF1>VREF2. Also, as with the comparator circuit 2, the comparator circuit 7 receives an input of the same comparison timing signal from the comparison-timing-signal generator circuit 5.

Figure 4:
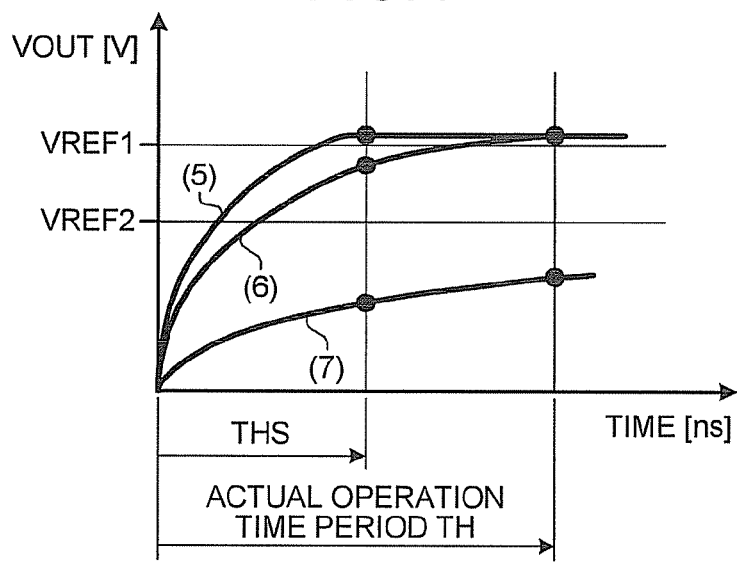
FIG. 4 is a diagram for explaining the operation of the current controlling unit depicted in FIG. 3.

Next, the operation is explained with reference to FIG. 4. FIG. 4 is a diagram for explaining the operation of the current controlling unit depicted in FIG. 3. In FIG. 4, as with FIG. 2, only the settling characteristic when the output voltage VOUT rises is depicted. Characteristics (5), (6), and (7) depicted in FIG. 4 are settling characteristics of the output voltage VOUT provided to the comparator circuits 2 and 7 before calibration when a fixed voltage is actually provided to the operational amplifier 1. However, the characteristic (6) may be a settling characteristic after calibration. A time period THS and an actual operation time period TH are identical to those explained with reference to FIG. 2.

In the characteristic (5), since the current value of the operational amplifier 1 is large, the output voltage VOUT increases with early rising to reach output saturation immediately after a lapse of the time period THS. The output voltage at the time of output saturation in the characteristic (5) exceeds the reference voltage VREF1. In the characteristic (6), since the current value of the operational amplifier 1 is small, the output voltage VOUT increases as rising slower than the characteristic (5). Immediately after a lapse of the time period THS, no output saturation is shown yet, and its voltage is at a level between the reference voltage VREF1 and the reference voltage VREF2. In the characteristic (7), since the current value of the operational amplifier 1 is further smaller, the output voltage VOUT increases as rising further slower than the characteristic (6). The voltage level immediately after a lapse of the time period THS does not reach the reference voltage VREF2.

When the comparison timing signal is input from the comparison-timing-signal generator circuit 5, the comparator circuit 2 compares the output voltage VOUT of the operational amplifier 1 and the reference voltage VREF1, while the comparator circuit 7 compares the output voltage VOUT of the operational amplifier 1 and the reference voltage VREF2. Then, these comparator circuits 2 and 7 output the respective comparison results to the control-signal generation circuit 8. In this example, the relation in magnitude between the output voltage VOUT and the reference voltages VREF1 and VREF2 indicated by the comparator circuits 2 and 7 is any one of "VOUT>VREF1" (characteristic (5)), "VREF1>VOUT>VREF2" (characteristic (6)), and "VOUT<VREF2" (characteristic (7)).

Based on the comparison results from the comparator circuits 2 and 7, the control-signal generation circuit 8 outputs to the current control circuit 9 a control signal for instruction as to how to control the current of the operational amplifier 1. In this example, a control signal for "decreasing the current" is generated when the comparison result indicates "VOUT>VREF1"; a control signal for "keeping the current as it is" when the comparison result indicates "VREF1>VOUT>VREF2", and a control signal for "increasing the current" is generated when the comparison result indicates "VOUT<VREF2".

The current control circuit 9 performs control for decreasing the current value of the operational amplifier 1 by a predetermined value when the control signal from the control-signal generation circuit 8 is to "decrease the current". Also, the current control circuit 9 performs control for maintaining the current value of the operational amplifier 1 at the current value when the control signal from the control-signal generation circuit 8 is to "keep the current as it is". Furthermore, the current control circuit 9 performs control for increasing the current value of the operational amplifier 1 by a predetermined value when the control signal from the control-signal generation circuit 8 is to "increase the current".

The calibration control circuit 6 monitors the comparison results at the comparator circuits 2 and 7. When the first comparison result indicates "VOUT>VREF1" (when the settling characteristic of the operational amplifier 1 shows the characteristic (5) depicted in FIG. 4), the calibration control circuit 6 controls each component so that the calibration as explained above for decreasing the current value by a predetermined value is repeated, until the settling characteristic of the operational amplifier 1 becomes the characteristic (6) depicted in FIG. 4 (until the comparison result becomes "VREF1>VOUT>VREF2"). Then, when the settling characteristic of the operational amplifier 1 becomes the characteristic (6) depicted in FIG. 4 and the comparison result indicates "VREF1>VOUT>VREF2", the calibration ends.

When the calibration control circuit 6 monitors the comparison results at the comparator circuits 2 and 7 and the first comparison result indicates "VOUT<VREF2" (when the settling characteristic of the operational amplifier 1 shows the characteristic (7) depicted in FIG. 4), each component is controlled so that calibration as explained above for increasing the current value by a predetermined value is repeated, until the settling characteristic of the operational amplifier 1 becomes the characteristic (6) depicted in FIG. 4 (until the comparison result becomes "VREF1>VOUT>VREF2"). Then, when the settling characteristic of the operational amplifier 1 becomes the characteristic (6) depicted in FIG. 4 and the comparison result indicates "VREF1>VOUT>VREF2", the calibration ends.

When the calibration control circuit 6 monitors the comparison results at the comparator circuits 2 and 7 and the first comparison result indicates "VREF1>VOUT>VREF2" (when the settling characteristic of the operational amplifier 1 shows the characteristic (6) depicted in FIG. 4), the calibration ends in principle.

As explained above, according to the second embodiment, in addition to the calibration according to the first embodiment being performed, when the voltage level in the settling characteristic of the operational amplifier is below the reference value, the calibration of increasing the current to bring the level of the output voltage close to the reference value is performed. Therefore, the current of the operational amplifier is more appropriately controlled compared with the first embodiment. Therefore, for example, the current of the operational amplifier can be controlled according to the operation mode.

Here, as can be seen from the first and second embodiments, the number of comparator circuits can be increased to three or more. In this case, although specific examples thereof will be explained further below, a finer current control can be performed compared with the case of two comparator circuits.

Also, the control-signal generation circuits 3 and 8 depicted in FIGS. 1 and 3, respectively, may be omitted, and the outputs from the comparator circuits 2 and 7 may be directly provided to the current control circuits 4 and 9 to achieve similar calibration.

Furthermore, when the A/D converter is of a pipeline or cyclic type, a comparator circuit and a decoder that are included in such a pipeline or cyclic type can be used also as the comparator circuits 2 and 7 and the control-signal generation circuits 3 and 8. In the following, a specific example of configuration is explained as another embodiment in which the current controlling unit explained above is incorporated in an A/D converter of a pipeline or cyclic type to perform calibration. Here, the calibration control circuit 6 is not depicted because it is incorporated in an upper apparatus of the A/D converter or a control device of an electronic device where the A/D converter is implemented.

Figure 5:
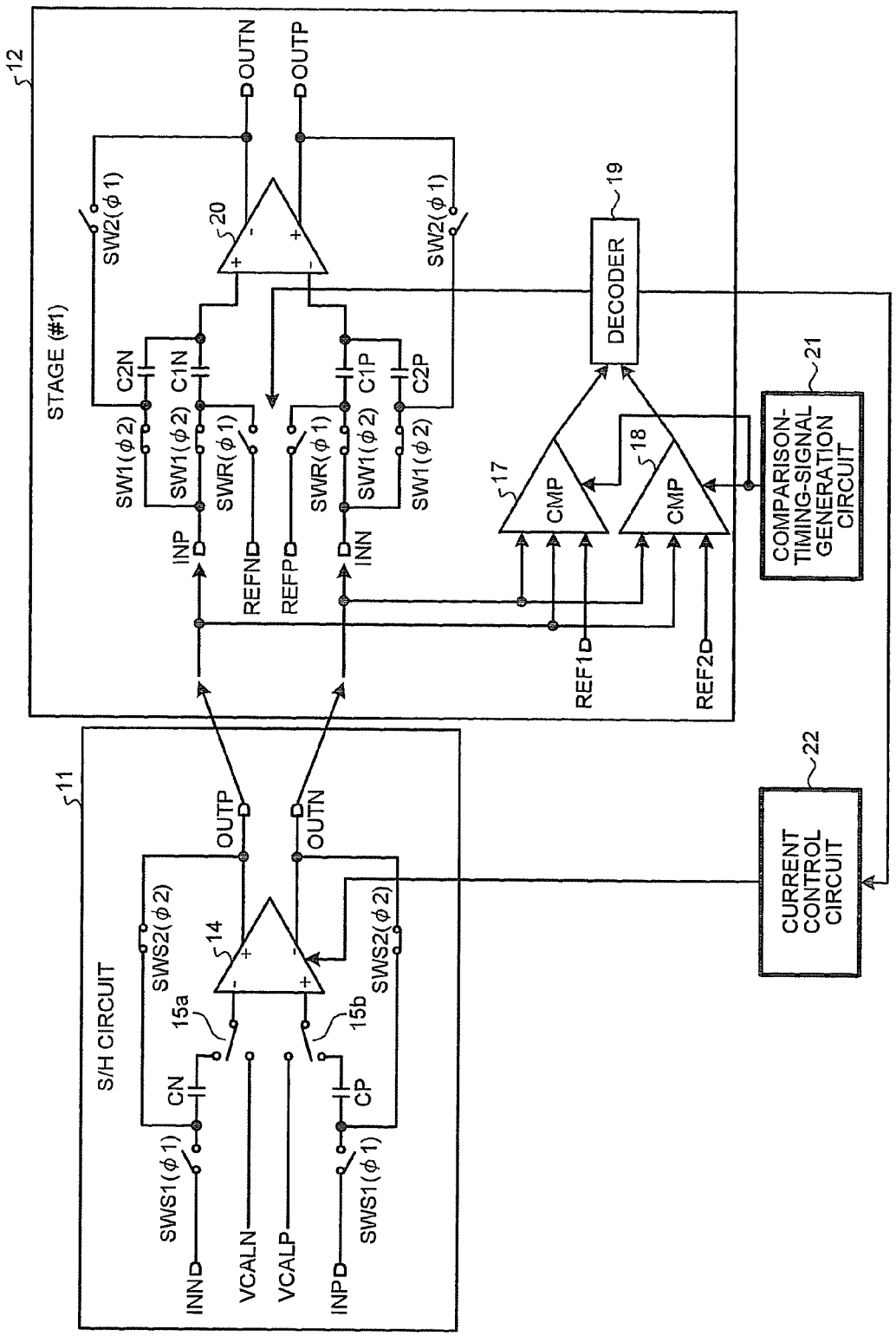
FIG. 5 is a block diagram of a specific example of configuration of an A/D converter according to a third embodiment of the present invention.

FIG. 5 is a block diagram of a specific example of configuration of an A/D converter according to a third embodiment of the present invention. In the third embodiment, an example of configuration is explained in which the current controlling unit according to the second embodiment is incorporated in an A/D converter of a pipeline or cyclic type.

In FIG. 5, for example, when an operational amplifier 14, which is a component of a sample/hold (S/H) circuit 11 at an input stage in a pipeline-type A/D converter, is to be controlled, CMPs 17 and 18 and a decoder 19 included in an initial stage (#1) 12 for pipeline processing are used in common for both of actual operation and calibration. Also, in this example of configuration, switches 15a and 15b are disposed on an input side of the operational amplifier 14, and a comparison-timing-signal generation circuit 21 and a current control circuit 22 are added.

In FIG. 5, in the S/H circuit 11, with the calibration control circuit, the switches 15a and 15b disposed on the input side of the operational amplifier 14 are switching-controlled so as to cause sample values held in capacitative elements CN and CP to be input to an inverting input terminal (−) and a non-inverting input terminal (+), respectively, of the operational amplifier 14 at the time of an actual operation thereof and to cause calibration voltages VCALN and VCALP to be provided to the inverting input terminal (−) and the non-inverting input terminal (+), respectively, of the operational amplifier 14 at the time of calibration.

An output from the operational amplifier 14 is input to the comparator circuits 17 and 18 at the stage (#1) 12, and is also input to an operational amplifier 20 via the S/H circuit (switches SW1 and SWR and capacitative elements C1N, C2N, C1P, and C2P).

Reference voltages REF1 and REF2 for use in the comparator circuits 17 and 18 at the stage (#1) 12 correspond to the reference voltages VREF1 and VREF2 depicted in FIG. 3, and the relation in magnitude therebetween is REF1>REF2.

In the present embodiment, the reference voltages REF1 and REF2 are used in common for both of actual operation and calibration with different applications. If such usage in common is not appropriate, a reference voltage for use in calibration can be selected from a plurality of reference voltages for the pipeline-type A/D converter. If there is no appropriate voltage to be selected therefrom, a new voltage can be provided.

At the time of an actual operation, a hold value is output to the stage (#1) 12 from the operational amplifier 14 included in the S/H circuit 11. Immediately after a lapse of the actual operation time period TH depicted in FIG. 4, the comparator circuit 17 included in the stage (#1) 12 compares the hold value from the S/H circuit 11 and the reference voltage REF1, while the comparator circuit 18 included in the stage (#1) 12 compares the hold value from the S/H circuit 11 and the reference voltage REF2. The comparator circuits 17 and 18 then output their comparison results (in this example, determination results of a logical value of the most significant bit) to the decoder 19. Based on the comparison results, the decoder 19 generates and outputs a control signal for performing an adding/subtracting process on sample values held at the capacitative elements C1N and C1P. With this, a hold value for use in determination of a second-bit logical value is output from the operational amplifier 20 to a second stage (#2) not shown.

Also, at the time of calibration before an actual operation, the operational amplifier 14 included in the S/H circuit 11 outputs a voltage value with a settling characteristic to the stage (#1) 12. Then, as with the comparison-timing-signal generation circuit 5 depicted in FIG. 3, the comparison-timing-signal generation circuit 21 generates a comparison timing signal immediately after a lapse of the time period THS depicted in FIG. 4, and then outputs the generated comparison timing signal to the comparator circuits 17 and 18 included in the stage (#1) 12.

According to the comparison timing signal input from the comparison-timing-signal generation circuit 21, the comparator circuit 17 included in the stage (#1) 12 compares the voltage value with the settling characteristic from the S/H circuit 11 and the reference voltage REF1, while the comparator circuit 18 included in the stage (#1) 12 compares the voltage value with the settling characteristic from the S/H circuit 11 and the reference voltage REF2. The comparator circuits 17 and 18 then output their comparison results to the decoder 19. Then, as with the control-signal generation circuit 8 depicted in FIG. 3, the decoder 19 generates a control signal for instruction of any one of "decreasing the current", "keeping the current as it is", and "increasing the current". Then, as with the current control circuit 9 depicted in FIG. 3, according to the instruction of the control signal from the decoder 19, the current control circuit 22 controls the current of the operational amplifier 14 included in the S/H circuit 11.

With this, the current of the operational amplifier 14 included in the S/H circuit 11 can be controlled to an optimum value before an actual operation, thereby reducing power consumption of the pipeline-type A/D converter at the time of an actual operation.

Figure 6:
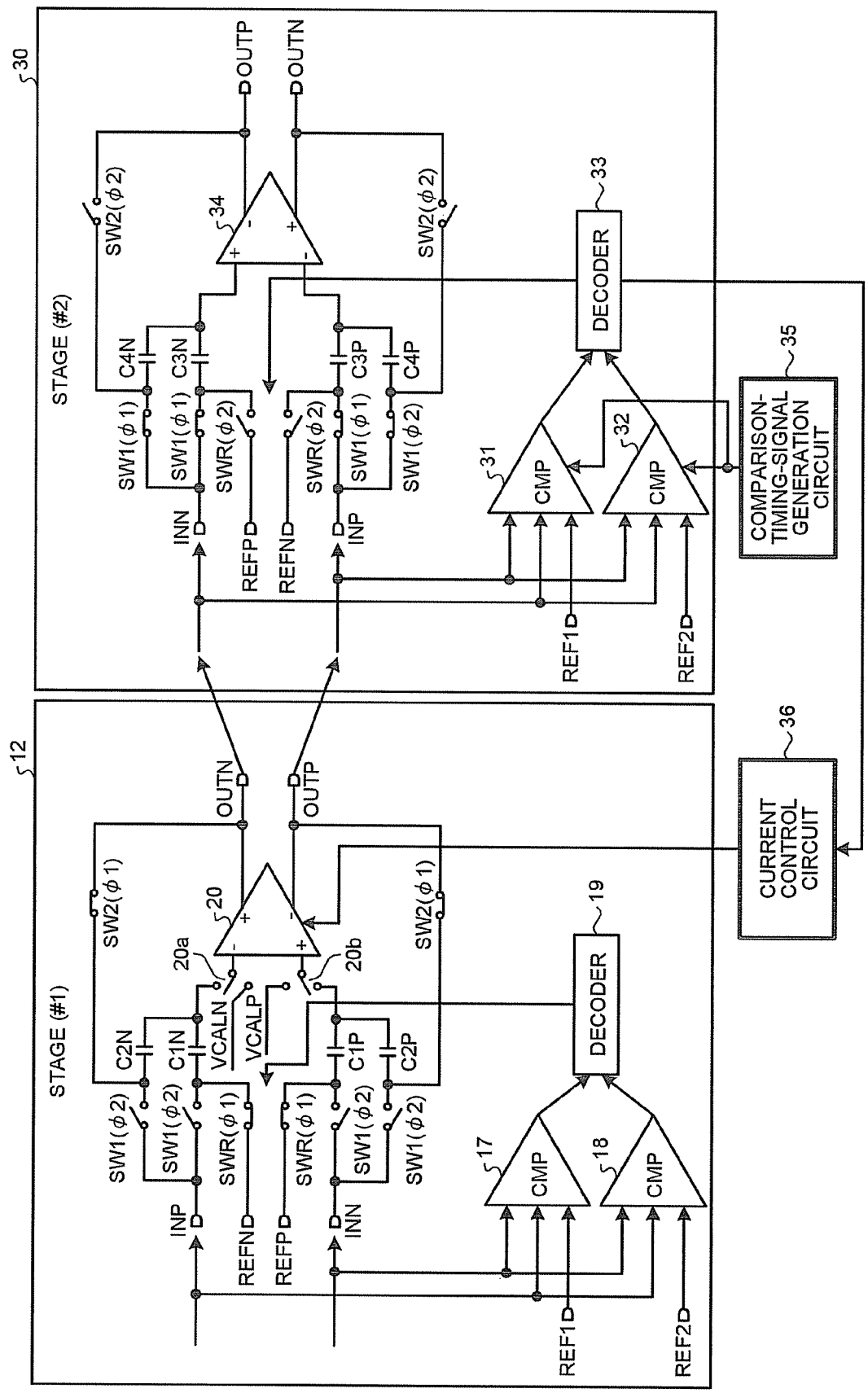
FIG. 6 is a block diagram of a specific example of configuration of an A/D converter according to a fourth embodiment of the present invention.

FIG. 6 is a block diagram of a specific example of configuration of an A/D converter according to a fourth embodiment of the present invention. In the fourth embodiment, an example of configuration is explained in which the current controlling unit according to the second embodiment is incorporated in a stage for pipeline processing of the pipeline-type A/D converter.

In FIG. 6, for example, when the operational amplifier 20, which is a component of the first stage (#1) 12 in the pipeline-type A/D converter, is to be controlled, comparator circuits 31 and 32 and a decoder 33 included in a next stage (#2) 30 are used in common for both of actual operation and calibration. Also, in this example of configuration, switches 20a and 20b are disposed on an input side of the operational amplifier 20, and a comparison-timing-signal generation circuit 35 and a current control circuit 36 are added.

In FIG. 6, at the stage (#1) 12, with the calibration control circuit, the switches 20a and 20b disposed on the input side of the operational amplifier 20 are switching-controlled so as to cause sample values held in capacitative elements C1N, C2N, C1P, and C2P to be input to an inverting input terminal (−) and a non-inverting input terminal (+), respectively, of the operational amplifier 20 at the time of an actual operation thereof and to cause calibration voltages VCALN and VCALP to be provided to the inverting input terminal (−) and the non-inverting input terminal (+), respectively, of the operational amplifier 20 at the time of calibration.

An output from the operational amplifier 20 is input to the comparator circuits 31 and 32 at the stage (#2) 30, and is also input to an operational amplifier 34 via the S/H circuit (switches SW1 and SWR and capacitative elements C3N, C4N, C3P, and C4P).

Reference voltages REF1 and REF2 for use in the comparator circuits 31 and 32 included in the stage (#2) 30 correspond to those for use in the comparator circuits 17 and 18 included in the stage (#1) 12 and, as with the third embodiment, they are used in common for both of actual operation and calibration.

At the time of an actual operation, immediately after a lapse of the actual operation time period TH depicted in FIG. 4, the comparator circuit 17 included in the stage (#1) 12 compares the hold value from the S/H circuit 11 and the reference voltage REF1, while the comparator circuit 18 included in the stage (#1) 12 compares the hold value from the S/H circuit 11 and the reference voltage REF2. The comparator circuits 17 and 18 then output their comparison results (in this example, determination results of a logical value of the most significant bit) to the decoder 19. Based on the comparison results, the decoder 19 generates and outputs a control signal for performing an adding/subtracting process on sample values held at the capacitative elements C1N and C1P. With this, a hold value for use in determination of a second-bit logical value is output from the operational amplifier 20 to the next stage (#2) 30.

At the second stage (#2) 30, immediately after a lapse of the actual operation time period TH depicted in FIG. 4, the comparator circuit 31 compares the hold value from the stage (#1) 12 and the reference voltage REF1, while the comparator circuit 32 compares the hold value from the stage (#1) 12 and the reference voltage REF2. The comparator circuits 31 and 32 then output their comparison results (in this example, determination results of a second-bit logical value) to the decoder 33. Based on the comparison results, the decoder 33 generates and outputs a control signal for performing an adding/subtracting process on sample values held at the capacitative elements C3N and C3P. With this, a hold value for use in determination of a third-bit logical value is output from the operational amplifier 34 to a next stage (#3) not shown.

Also, at the time of calibration before an actual operation, the operational amplifier 20 included in the stage (#1) 12 outputs a voltage value with a settling characteristic to the stage (#2) 30. Then, as with the comparison-timing-signal generation circuit 5 depicted in FIG. 3, the comparison-timing-signal generation circuit 35 generates a comparison timing signal immediately after a lapse of the time period THS depicted in FIG. 4, and then outputs the generated comparison timing signal to the comparator circuits 31 and 32 included in the stage (#2) 30.

According to the comparison timing signal input from the comparison-timing-signal generation circuit 35, the comparator circuit 31 included in the stage (#2) 30 compares the voltage value with the settling characteristic from the stage (#1) 12 and the reference voltage REF1, while the comparator circuit 32 included in the stage (#2) 30 compares the voltage value with the settling characteristic from the stage (#1) 12 and the reference voltage REF2. The comparator circuits 31 and 32 then output their comparison results to the decoder 33. Then, as with the control-signal generation circuit 8 depicted in FIG. 3, the decoder 33 generates a control signal for instruction of any one of "decreasing the current", "keeping the current as it is", and "increasing the current". Then, as with the current control circuit 9 depicted in FIG. 3, according to the instruction of the control signal from the decoder 33, the current control circuit 36 controls the current of the operational amplifier 20 included in the stage (#1) 12.

With this, the current of the operational amplifier 20 included in the stage (#1) 12 can be controlled to an optimum value before an actual operation, thereby reducing power consumption of the pipeline-type A/D converter at the time of an actual operation.

Figure 7:
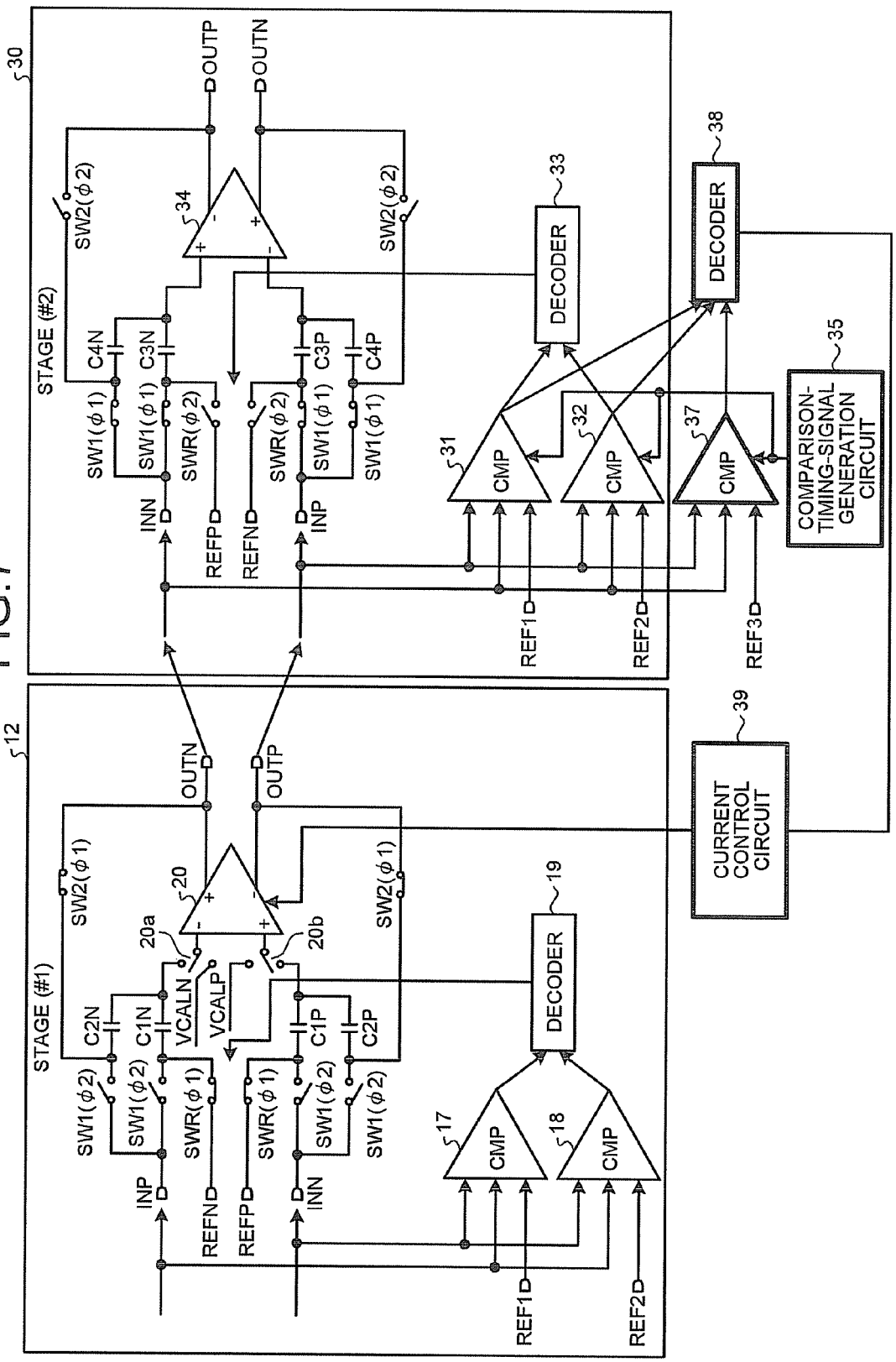
FIG. 7 is a block diagram of a specific example of configuration of an A/D converter according to a fifth embodiment of the present invention.

FIG. 7 is a block diagram of a specific example of configuration of an A/D converter according to a fifth embodiment of the present invention. In the fifth embodiment, an example of configuration is explained in which three comparator circuits of the current controlling unit are incorporated in an A/D converter of a pipeline or cyclic type.

In FIG. 7, for example, in the configuration depicted in FIG. 6 (fourth embodiment), a CMP 37 and a decoder 38 are added. Also, a current control circuit depicted in FIG. 7 is different from the current control circuit 36 depicted in FIG. 6, and is therefore represented as a current control circuit 39.

In FIG. 7, at the stage (#2) 30, the comparator circuits 31 and 32 are used in common for both of actual operation and calibration, but the decoder 33 operates only at the time of an actual operation. The added comparator circuit 37 and decoder 38 operate only at the time of calibration.

To the added comparator circuit 37, as with the comparator circuits 31 and 32, an output from the stage (#1) 12 is input, and also a comparison timing signal is input from the comparison-timing-signal generation circuit 35. Furthermore, to the comparator circuit 37, a third reference voltage REF3 is input. A relation in magnitude is REF1>REF2>REF3.

At the time of calibration, based on the comparison results from the comparator circuits 31, 32, and 37, the decoder 38 outputs to the current control circuit 39 a control signal for instruction as to how to control the current of the operational amplifier 20.

The relation in magnitude between the output voltage VOUT of the operational amplifier 20 and the reference voltages REF1, REF2, and REF3 indicated by the comparison result from the comparator circuits 31, 32, and 37 is any one of "VOUT>REF1", "REF1>VOUT>REF2", "REF2>VOUT>REF3", and "VOUT<REF3".

Thus, the decoder 38 generates a control signal for "decreasing the current" when the comparison result indicates "VOUT>REF1"; generates a control signal for "keeping the current as it is" when the comparison result indicates "REF1>VOUT>REF2"; generates a control signal for "increasing the current" when "REF2>VOUT>REF3", and generates a control signal for "further increasing the current" when the comparison result indicates "VOUT<REF3".

When the input control signal indicates any one of "decreasing the current", "keeping the current as it is", and "increasing the current", the current control circuit 39 performs control similar to that of the current control circuit 9 depicted in FIG. 3. When the input control signal indicates "further increasing the current", the current control circuit 39 performs control of increasing the current of the operational amplifier 20, for example, twice as large as a predetermined value for use in "increasing the current".

As with the second embodiment, calibration is repeated until "REF1>VOUT>REF2" where the comparison result shows "keeping the current as it is".

In this case, when three reference voltages are used with the time period THS being the same, a finer current control can be performed compared with the case of using two reference voltages, thereby making it possible to shorten the calibration time. Also, the degree of accuracy required for the time period THS and the reference voltages can be relieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An A/D converter with one or more operational amplifiers as components, the A/D converter comprising:
   a current controlling unit that is activated before an actual operation of the A/D converter to control a current of at least one of the operational amplifiers, based on a settling characteristic of the operational amplifier, the current controlling unit includes:
   one or more comparator circuits that compare an output voltage of the operational amplifier with one or more reference values at a time near a timing when the output voltage of the operational amplifier starts saturation when a fixed voltage is provided;
   a control-signal generation circuit that generates a control signal for specifying an instruction of controlling the current of the operational amplifier, based on the comparison result of the comparator circuits; and
   a current control circuit that controls the current of the operational amplifier according to the instruction of the control signal.

2. The A/D converter according to claim 1, wherein
   the operational amplifier is an operational amplifier that outputs a hold value to a next conversion stage of a pipeline processing stage in a sample/hold circuit at a conversion stage in the pipeline processing stage of a pipeline-type A/D converter, and
   the comparator circuits and the control-voltage-signal generation circuits are comparator circuits and a decoder included in the next conversion stage.

3. The A/D converter according to claim 1, wherein
   the operational amplifier is an operational amplifier that outputs a hold value to a next processing circuit in a sample/hold circuit in a cyclic-type A/D converter, and
   the comparator circuits and the control-signal generation circuits are comparator circuits and a decoder included in the next processing circuit.

4. The A/D converter according to claim 1, wherein
   a timing for each of the comparator circuits to perform a comparing operation is within an actual operation time of the comparator circuit in a pipeline-type A/D converter.

5. The A/D converter according to claim 1, wherein
   a timing for each of the comparator circuits to perform a comparing operation is within an actual operation time of the comparator circuit in a cyclic-type A/D converter.

6. The A/D converter according to claim 1, wherein
   the current controlling unit further includes a comparison-timing-signal generation circuit that generates a comparison timing signal for specifying a timing of the comparator circuits to perform a comparing operation, based on a timing when the fixed voltage is provided to the operational amplifier.

7. The A/D converter according to claim 1, wherein
   the current controlling unit further includes a calibration control circuit that outputs the fixed voltage to the operational amplifier before the actual operation of the A/D converter, monitors the comparison result of the comparator circuits at that time, and repeatedly outputs the fixed voltage to the operational amplifier once or a plurality of times so that the output voltage of the operational amplifier, when the fixed voltage is provided, is brought close to a predetermined one of the reference values.

8. The A/D converter according to claim 1, wherein
   the operational amplifier is an operational amplifier that outputs a hold value to an initial conversion stage of a pipeline processing stage in a sample/hold circuit disposed at a place preceding to the pipeline processing stage of a pipeline-type A/D converter, and
   the comparator circuits and the control-voltage-signal generation circuit are comparator circuits and a decoder included in the initial conversion stage.

* * * * *